US008912498B2

(12) United States Patent
Yang et al.

(10) Patent No.: US 8,912,498 B2
(45) Date of Patent: Dec. 16, 2014

(54) HALIDE SCINTILLATOR FOR RADIATION DETECTION

(75) Inventors: Kan Yang, Knoxville, TN (US); Mariya Zhuravleva, Knoxville, TN (US); Charles L. Melcher, Oak Ridge, TN (US); Piotr Szupryczynski, Knoxville, TN (US)

(73) Assignees: University of Tennessee Research Foundation, Knoxville, TN (US); Siemens Medical Solutions USA, Inc., Malvern, PA (US)

( * ) Notice: Subject to any disclaimer, the term of this patent is extended or adjusted under 35 U.S.C. 154(b) by 234 days.

(21) Appl. No.: 13/098,642

(22) Filed: May 2, 2011

(65) Prior Publication Data

US 2011/0272585 A1 Nov. 10, 2011

Related U.S. Application Data

(60) Provisional application No. 61/332,934, filed on May 10, 2010.

(51) Int. Cl.
| | |
|---|---|
| *G01T 1/20* | (2006.01) |
| *C09K 11/85* | (2006.01) |
| *C09K 11/77* | (2006.01) |
| *G21K 4/00* | (2006.01) |

(52) U.S. Cl.
CPC ............... *C09K 11/772* (2013.01); *G21K 4/00* (2013.01)
USPC .................................. 250/362; 252/301.4 H

(58) Field of Classification Search
CPC .... G01T 1/2023; C09K 11/61; C09K 11/772; C01F 17/0056; C01F 17/0068
USPC .................................. 252/301.4 H; 250/362
See application file for complete search history.

(56) References Cited

U.S. PATENT DOCUMENTS

| | | | |
|---|---|---|---|
| 6,369,391 B1 | 4/2002 | Hefetz et al. | |
| 2005/0188914 A1* | 9/2005 | Iltis et al. | 117/2 |

(Continued)

FOREIGN PATENT DOCUMENTS

| | | |
|---|---|---|
| CN | 1847359 A | 10/2006 |
| CN | 101288003 A | 10/2008 |
| CN | 101646748 A | 2/2010 |

OTHER PUBLICATIONS

Gul Rooh, Heedong Kang, H.J. Kim, H. Park, Sunghwan Kim, "The growth and scintillation properties of Cs2NaCeCl6 single crystal." Journal of Crystal Growth 311 (Jan. 20, 2009) pp. 2470-2473. <doi:10.1016/j.jcrysgro.2009.01.091>.*

(Continued)

*Primary Examiner* — Constantine Hannaher
(74) *Attorney, Agent, or Firm* — Peter Kendall

(57) ABSTRACT

A halide scintillator material is disclosed. The material is single-crystalline and has a composition of the formula $A_3MBr_{6(1-x)}Cl_{6x}$ (such as $Cs_3CeBr_{6(1-x)}Cl_{6x}$) or $AM_2Br_{7(1-x)}Cl_{7x}$ (such as $CsCe_2Br_{7(1-x)}Cl_{7x}$), $0 \leq x \leq 1$, wherein A consists essentially of Li, Na K, Rb, Cs or any combination thereof, and M consists essentially of Ce, Sc, Y, La, Lu, Gd, Pr, Tb, Yb, Nd or any combination thereof. Furthermore, a method of making halide scintillator materials of the above-mentioned compositions is disclosed. In one example, high-purity starting halides (such as CsBr, CeBr₃, CsCl and CeCl₃) are mixed and melted to synthesize a compound of the desired composition of the scintillator material. A single crystal of the scintillator material is then grown from the synthesized compound by the Bridgman method. The disclosed scintillator materials are suitable for making scintillation detectors used in applications such as medical imaging and homeland security.

17 Claims, 13 Drawing Sheets

(56) References Cited

U.S. PATENT DOCUMENTS

2009/0140153 A1* 6/2009 Flamanc et al. ............ 250/368
2011/0272586 A1* 11/2011 Zhuravleva et al. ......... 250/362

OTHER PUBLICATIONS

Glodo, et al; "Cs2LiYCl6 : Ce Scintillator for Nuclear Monitoring Applications", IEEE Transactions on Nuclear Science, vol. 56, No. 3, Jun. 1, 2009, pp. 1257-1261.

Hawrami, R, et al., "Advanced Scintillator Materials for Nuclear Radiation Detection", Alabama A&M University Science, Technology, Engineering & Mathematics Day, Apr. 11, 2008, pp. 55-56.

Bessiere, et al, "Scintillation and Anomalous Emission in Elpasolite Cs2LiLuCl6:Ce3+", Journal of Luminescence 117 (2006) pp. 187-198.

Belikov, K.N., "Analytical Control of Ce Content in CsCexGd2-xCl7 Single Crystals by Inductively Coupled Plasma Atomic Emission Spectrometry", Abstract, retrieved form STN database accession No. 2009:60516, XP002643847, 2008.

Rooh, et al., "The Growth and Scintillation Properties of CsCe2Cl7 Crystal", Journal of Crystal Growth 311 (2008), pp. 128-131.

Meyer, G., "The Reduction of Rare-Earth Metal Halides with Unlike Metals—Woehler's Metallothermic Reduction", Z. Anorg. Allg. Chem., vol. 633, Jan. 1, 2007, pp. 2537-2552.

Karbowiak, M, et al, "Energy Transfer and Upconversion of Nd3+ doped RbY2Cl7", Journal of Luminescence 104 (2003) pp. 197-205.

EP Search Report in Application No. 11165489.3 dated Jul. 11, 2011.

Knoll Glenn F.; "Radiation Detection and Measurement"; General Properties of Radiation Detectors, pp. 95-103; New York (1979).

Higgins, et al, "Bridgman growth of LaBr3:Ce and LaCl3:Ce crystals for high-resolution gamma-ray spectrometers", J. Crystal Growth 287 (2006) 239-242.

Seifert, H.J., "Ternary chlorides of the trivalent early lanthanides: Phase diagrams, crystal structures and thermodynamic properties", J. Thermal Analysis and Calorimetry 67 (2002) 789-826.

Ma, et al, "Thermodynamic calculation of the GdCl3-ACl (A=Na,K,Rb,Cs) phase diagrams based on experimental data", Calphad, vol. 30, Issue 1, Mar. 2006, pp. 88-94.

Seifert, et al, "Structure and Stability of the Low-Temperature Modification of Compounds Cs3LnCl6 (Ln=La-Gd)", Journal of Solid State Chemistry, vol. 107, Issue 1, Nov. 1993, pp. 19-26.

Kapala, et al, "Modelling of the thermodynamic properties of the ABr-CeBr3 (A=Li-Cs ) systems", Calphad, vol. 34, Issue 1, Mar. 2010, pp. 15-19.

Rycerz, et al, "Phase diagram and electrical conductivity of the CeBr3—CsBr binary system", J. Therm. Anal. Calorim. 97 (2009), pp. 1015-1021.

Kramer, et al, "Development and characterization of highly efficient new cerium doped rare earth halide scintillator materials", J. Mater. Chem., 2006, 16, pp. 2773-2780.

Cherepy, et al, "Strontium and barium iodide high light yield scintillators", Applied Physics Letters, vol. 92, (2008), (3 pages).

Xinhua, et al, "Fluorescence spectra of ARE2I5 and AREI3 in the solid state (A [identical to] K, Rb, Cs, Ti; RE [identical to] Sm, Eu)", Journal of Alloys and Compounds, vol. 180, Issues 1-2, Mar. 25, 1992, pp. 235-238.

Baopeng, et al, Synthesis and structure of AEuI3 (A[triple bond; length as m-dash]Rb, Cs) and AEu2I5 (A[triple bond; length as m-dash]K, Rb, Cs), Journal of Alloys and Compounds, vol. 181, Issues 1-2, Proceedings of the 19th Rare Earth Research Conference, Apr. 3, 1992, pp. 511-514.

Guangming, et al, "The study of CsI-EuI2 binary system", [J] Acta Chim. Sinica, 1995,V53(10): 947-951 (English abstract attached).

Partial Search Report dated Sep. 19, 2011 in EP Patent Application EP11165494.

Zhuraleva, et al., "Crystal Growth and Scintillation Properties of Cs3CeCl6 and CsCe2Cl7", Journal of Crystal Growth 318 (Mar. 1, 2011) pp. 809-812.

Lisek, et al., "High-temperature study of phase equilibria in the systems CsCl-LnCl3 (Cn=Ce, Nd) by Knudsen effusion mass spectrometry", Journal of Thermal Analysis and Calorimetry, vol. 55, (Feb. 1, 1999), pp. 627-637.

Extended EPSearch Report dated Jan. 4, 2012 in EP Patent Application EP11165494.

Zhuraleva, et al., "Crystal growth and scintillation properties of Cs3CeX6 and CsCe2X7 (X=Cl, Br)," Nuclear Science Symposium Conference Record (NSS/MIC), 2010 IEEE , vol., no., pp. 1296-1299, Oct. 30, 2010-Nov. 6, 2010.

Rooh, et al., "The growth and characterization of the cerium contained inorganic halide scintillators" Database Compendex [Online] Engineering Information, XP-002666180, Database accession No. E2010331314, 8249, *abstract*, Key Engineering Materials [Key Eng Mater]. vol. 442, pp. 275-282, 2010.

Rycerz, et al., "Phase diagram and electrical conductivity of the CeBr3-CsBr binary system", J. Therm Anal Calorim (2009) 97:1015-1021.

Office Action and Search Report of Chinese Patent Application No. 201110175721.2 dated Mar. 5, 2013, with letter from M. Shi Kehu to Mr. Peter L. Kendall of Apr. 28, 2013.

* cited by examiner

_US 8,912,498 B2_

HALIDE SCINTILLATOR FOR RADIATION DETECTION

CROSS-REFERENCE TO RELATED APPLICATIONS

The present application claims the benefit of U.S. Provisional Application Ser. No. 61/332,934, filed May 10, 2010. The present application also relates to commonly assigned non-provisional U.S. patent application entitled "CHLORIDE SCINTILLATOR FOR RADIATION DETECTION", filed on the same day as the present application and claiming the benefit of U.S. Provisional Application Ser. No. 61/332,972, filed May 10, 2010 and non-provisional U.S. patent application entitled "IODIDE SCINTILLATOR FOR RADIATION DETECTION", filed on the same day as the present application and claiming the benefit of U.S. Provisional Application Ser. No. 61/332,945, filed May 10, 2010. All applications are incorporated herein by reference.

TECHNICAL FIELD

This disclosure relates to scintillator materials used for detecting ionizing radiation, such as X-rays, gamma rays and thermal neutron radiation, in security, medical imaging, particle physics and other applications. This disclosure relates particularly to halide scintillator materials. Certain arrangements also relate to specific compositions of such scintillator material, method of making the same and devices with such scintillator materials as components.

Scintillator materials, which emit light pulses in response to impinging radiation, such as X-rays, gamma rays and thermal neutron radiation, are used in detectors that have a wide range of applications in medical imaging, particle physics, geological exploration, security and other related areas. Considerations in selecting scintillator materials typically include, but are not limited to, luminosity, decay time and emission wavelengths.

While a variety of scintillator materials have been made, there is a continuous need for superior scintillator materials.

SUMMARY OF THE DISCLOSURE

The present disclosure relates generally to halide scintillator materials and method of making such scintillator materials. In one arrangement, a halide scintillator material is single-crystalline and has a composition of the formula $A_3MBr_{6(1-x)}Cl_6x$, $0 \leq x \leq 1$, wherein A consists essentially of Li, Na K, Rb, Cs or any combination thereof, and M consists essentially of Ce, Sc, Y, La, Lu, Gd, Pr, Tb, Yb, Nd or any combination thereof. In another arrangement, a halide scintillator material is single-crystalline and has a composition of the formula $A_3MBr_{7(1-x)}Cl_{7x}$, $0 \leq x \leq 1$ wherein A consists essentially of Li, Na K, Rb, Cs or any combination thereof, and M consists essentially of Ce, Sc, Y, La, Lu, Gd, Pr, Tb, Yb, Nd or any combination thereof. Specific examples of these scintillator materials include single-crystalline $Cs_3CeBr_{6(1-x)}Cl_{6x}$ and $CsCe_2Br_{7(1-x)}Cl_{7x}$. More specific examples include the end members of the respective formulae: $Cs_3CeBr_6$ and $CsCe_2Br_7$, i.e., x=0; and $Cs_3CeCl_6$ and $CsCe_2Cl_7$, i.e., x=1. In arrangement, a halide scintillator material is single-crystalline and has a composition of the formula $A_3 MBr_{6(1-x)}Cl_{6x}$, wherein $0 \leq x \leq 1$.

A further aspect of the present disclosure relates to a method of making halide scintillator materials of the above-mentioned compositions. In one example, high-purity starting halides (such as CsBr, CeBr$_3$, CsCl and CeCl$_3$) are mixed and melted to synthesize a compound of the desired composition of the scintillator material. A single crystal of the scintillator material is then grown from the synthesized compound by the Bridgman method, in which a sealed ampoule containing the synthesized compound is transported from a hot zone to a cold zone through a controlled temperature gradient at a controlled speed to form a single-crystalline scintillator from molten synthesized compound.

DETAILED DESCRIPTION

I. Overview

Figure 1:
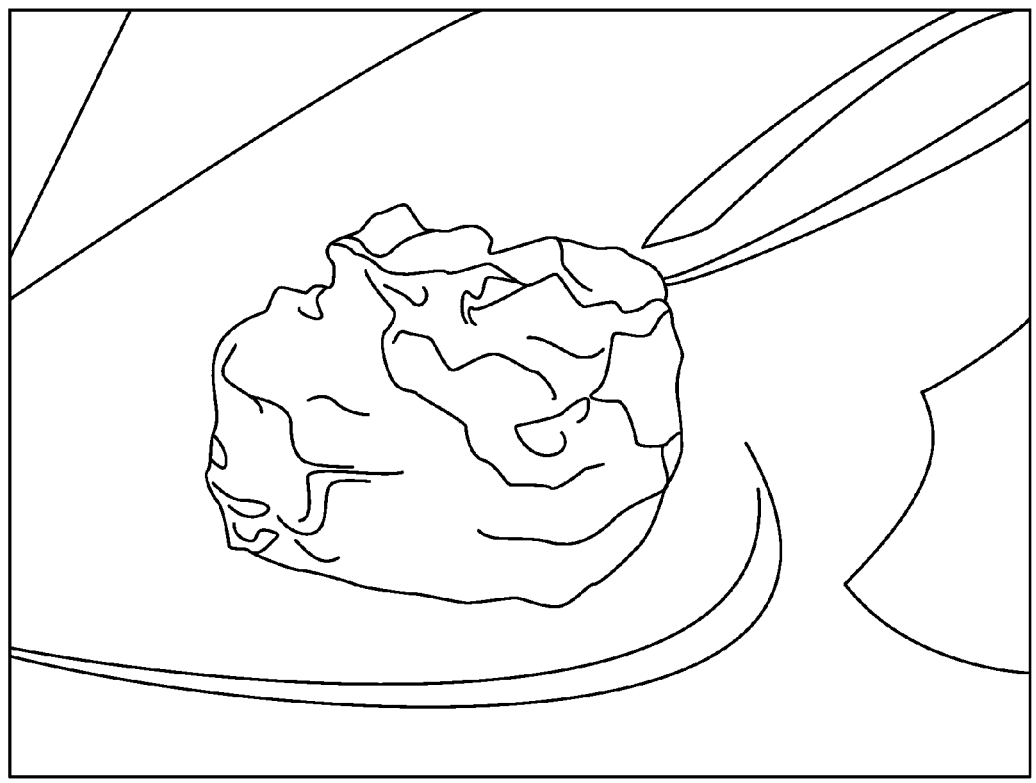
FIG. 1 shows a single crystal of $Cs_3CeCl_6$ made according to one aspect of the present disclosure.
Figure 2A:
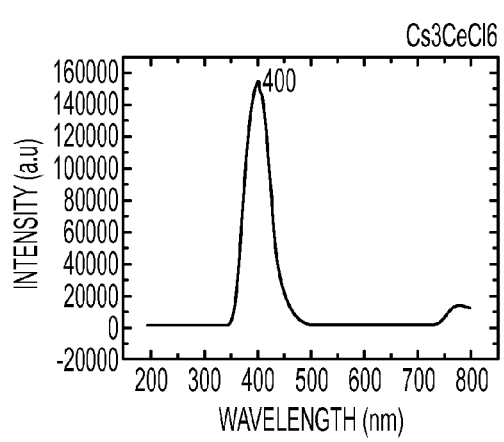
FIG. 2 shows radioluminescence spectra of (a) $Cs_3CeCl_6$, (b) $CsCe_2Cl_7$, (c) $Cs_3CeBr_6$ and (d) $CsCe_2Br_7$ single crystals; X-ray source: Tungsten, 35 kV, 0.1 mA.
Figure 2B:
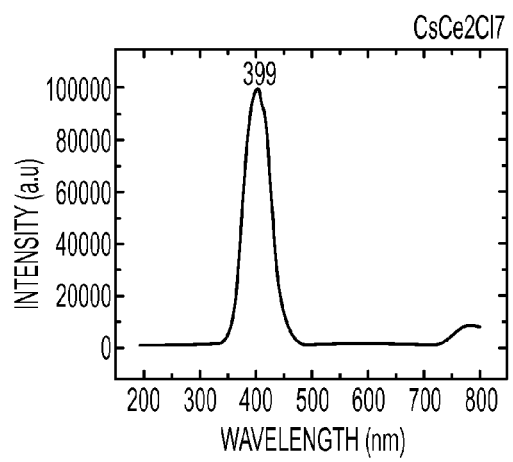
Figure 2C:
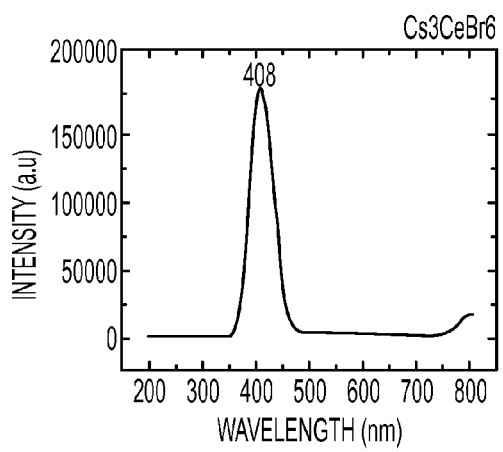
Figure 2D:
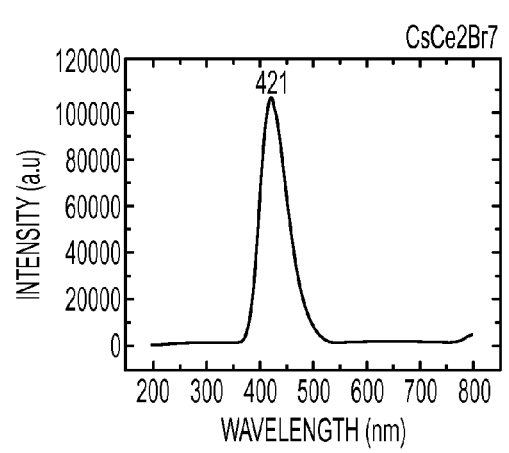
Figure 3A:
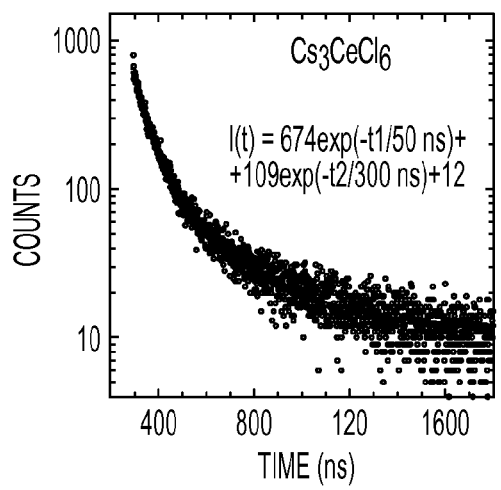
FIG. 3 shows scintillation decay time spectra of (a) $Cs_3CeCl_6$, (b) $Cs_3CeBr_6$, (c) $CsCe_2Cl_7$ and (d) $CsCe_2Br_7$ single crystals; the spectra were measured using $^{137}Cs$ gamma-ray source (662 keV).
Figure 3B:
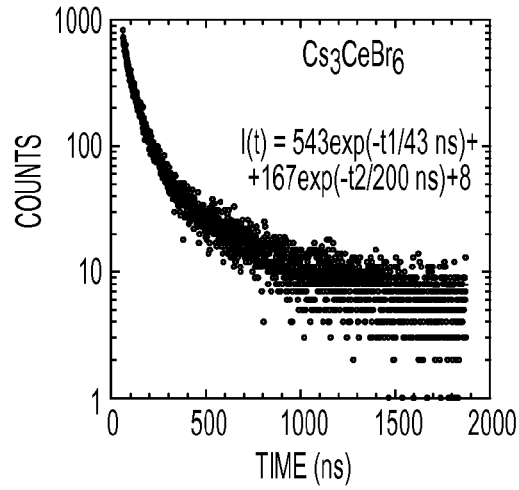
Figure 3C:
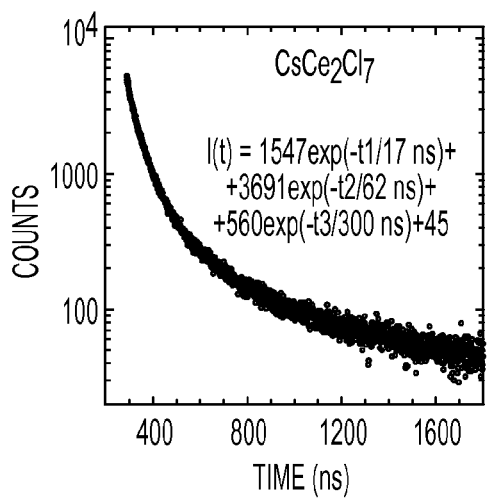
Figure 3D:
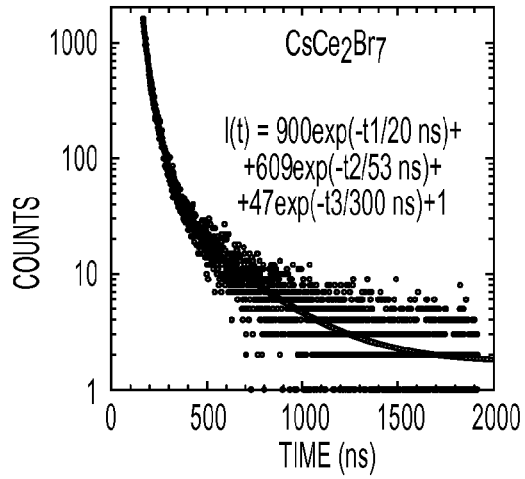

Inorganic scintillators are commonly used in nuclear and high-energy physics research, medical imaging, homeland security, and geological exploration. These materials typically possess sufficient stopping power for detection, high luminosity, high spectral energy resolution at room temperature and short decay time. Certain cerium-doped halides, such as LaCl$_3$:Ce and LaBr$_3$:Ce, have satisfactory scintillation properties at room temperature for gamma ray detection. Another desirable property of scintillators is a capability of neutron-gamma discrimination that is of importance for nuclear non-proliferation applications. Materials containing gadolinium, lithium and boron are employed to quickly and efficiently discriminate neutrons from gamma rays.

In one aspect of present disclosure, a halide scintillator material is single-crystalline and has a composition of the formula $A_3MB_{6(1-x)}Cl_{6x}$, $0 \leq x \leq 1$, wherein A consists essentially of Li, Na K, Rb, Cs or any combination thereof, and M consists essentially of Ce, Sc, Y, La, Lu, Gd, Pr, Tb, Yb, Nd or any combination thereof. In another arrangement, a halide scintillator material is single-crystalline and has a composition of the formula $AM_2Br_{7(1-x)}Cl_{7x}$, $0 \leq x \leq 1$, wherein A consists essentially of Li, Na K, Rb, Cs or any combination thereof, and M consists essentially of Ce, Sc, Y, La, Lu, Gd, Pr, Tb, Yb, Nd or any combination thereof. Specific examples of these scintillator materials include single-crystalline $Cs_3CeBr_{6(1-x)}Cl_{6x}$ and $CsCe_2Br_{7(1-x)}Cl_{7x}$. More specific examples include the end members of the respective formulae: $Cs_3CeBr_6$ and $CsCe_2Br_7$, i.e., x=0; and $Cs_3CeCl_6$ and $CsCe_2Cl_7$, i.e., x=1.

$Cs_3CeCl_6$, $Cs_3CeBr_6$, $CsCe_2Cl_7$ and $CsCe_2Br_7$ are known to be congruently-melting compounds and therefore good for practical crystal growth from the melt. The above materials have high enough densities and are expected to have fast scintillation decay and high light output due to Ce 5d-4f luminescence, which make them very suitable for applications in gamma ray and/or X-ray detection in such applications as medical imaging and homeland security.

A further aspect of the present disclosure relates to a method of making halide scintillator materials of the above-mentioned compositions. In one example, high-purity starting halides (such as CsBr, $CeBr_3$, CsCl and $CeCl_3$) are mixed and melted to synthesize a compound of the desired composition of the scintillator material. A single crystal of the scintillator material is then grown from the synthesized compound by the Bridgman method, in which a sealed ampoule containing the synthesized compound is transported from a hot zone to a cold zone through a controlled temperature gradient at a controlled speed to form a single-crystalline scintillator from molten synthesized compound.

In another aspect of the present disclosure, the above-described scintillator materials are used in radiation detection by scintillation. For example, a radiation detector can include a scintillator described above for generating photons in response to the impinging radiation. The scintillator is optically coupled to a photon detector, such as a photomultiplier tube (PMT), arranged to receive the photons generated by the scintillator and adapted to generate a signal indicative of the photon generation.

II. Example Configurations (a) Scintillator Crystal Growth

In one arrangement, a modified 24-zone Electro-Dynamic Gradient Mellen furnace with a translation mechanism was used to grow halide single crystals via the Bridgman technique. As a first step, these compounds were synthesized by mixing and melting starting anhydrous halides in quartz ampoules. Quartz ampoules were first baked and freshly cleaned by rinsing with a dilute HF solution and deionized water. High purity, anhydrous beads of starting compounds (e.g., CsCl and $CeCl_3$ for $Cs_3CeCl_6$ and $CsCe_2Cl_7$; CsBr and $CeBr_3$ for $Cs_3CeBr_6$ and $CsCe_2Br_7$; CsCl, $CeCl_3$, CsBr and $CeBr_3$ for $Cs_3CeBr_{6(1-x)}Cl_{6x}$ and $CsCe_2Br_{7(1-x)}Cl_{7x}$, $x \neq 0$) (available from Sigma-Aldrich)) were loaded into the cylindrical quartz ampoules in a nitrogen-purged glove box and sealed under $10^{-6}$ mbar vacuum with a hydrogen torch. The relative amounts of the starting compounds in one arrangement were chosen to achieve stoichiometry of the synthesized scintillator material. Examples include 3 CsBr:1 $CeBr_3$ for $Cs_3CeBr_6$ and 1 CsBr:2 $CeBr_3$ for $CsCe_2Br_7$ (molecular ratios). Other ratios can be used for desired degree of stoichiometry.

The ampoule was heated up to a temperature above the melting points of the starting halides. Then the synthesized compound was loaded into a specially designed quartz ampoule of about 15 mm in diameter to grow a single crystal, During the growth, the ampoule travels through the furnace from a hot zone to a cold zone at a rate generally in the range 0.5-2 mm/h. Cooling down was done at a rate of about 10° C./h. After the crystals were grown and removed from the growth ampoules, they were stored in mineral oil to protect from the atmosphere.

(b) Characterization of Scintillator Crystals

Certain samples were characterized without polishing while for certain others, plates of about 1-2 mm in thickness were cut from the boules and polished using a set of sand papers and mineral oil. To identify the obtained phase, powder X-ray diffraction (XRD) analysis was carried out in air at room temperature. To minimize the effects of self-absorption, small samples (typically 1-2 mm thick, 3 mm×3 mm) were selected for the optical characterization.

Photoluminescence spectra were obtained with a Horiba Jobin Yvon Fluorolog3 spectrofluorometer equipped with Xe lamp and monochromator. Scintillation time profiles were recorded using the time-correlated single photon technique and a $^{137}Cs$ gamma-ray source. Radioluminescence spectra were measured at RT under continuous irradiation from an X-ray generator (35 kV and 0.1 mA) using a PI Acton Spectra Pro SP-2155 monochromator. Light output measurements were carried out on samples covered in mineral oil and directly coupled to a photomultiplier tube (PMT) and covered with Teflon tape. A Hamamatsu 3177-50 PMT was used for absolute light output measurements. Gamma-ray energy spectra were recorded using a $^{137}Cs$ source with a 2 ms shaping time. The integral quantum efficiency of the PMT according to the emission spectrum of the scintillators was used to calculate the number of photons per unit gamma ray energy. The energy resolution, at 662 keV was determined from the full-width at half-maximum (FWHM) of the 662 keV photopeak.

(c) Example Results

According to certain aspects of the present disclosure, single crystals of the halide materials suitable for scintillator applications were made, and their scintillation properties were measured. A single crystal of $Cs_3CeCl_6$ made using the Bridgman method as described above is shown in the image in FIG. 1. The sample is approximately 1 cm across and slightly translucent. Similar single crystals of $Cs_3CeBr_6$, $CsCe_2Br_7$ and $CsCe_2Cl_7$ were also made. The above samples were shown to be homogeneous by X-ray diffraction analysis.

The single crystal scintillators described above have demonstrated high performance under optical, X-rays and gamma rays. These scintillators exhibit Ce 5d-4f luminescence.

FIG. 2 shows radioluminescence spectra of (a) $Cs_3CeCl_6$, (b) $CsCe_2Cl_7$, (c) $Cs_3CeBr_6$ and (d) $CsCe_2Br_7$ single crystals. The absolute light output and The energy resolution (FWHM) at 662 keV for certain samples are listed in Table I:

TABLE I

Selected Scintillator Properties

| Composition | Light Output, ph/MeV | Energy Resolution (ΔE), % @ 622 keV |
|---|---|---|
| $Cs_3CeCl_6$ | ~19,000 | 8.4 |
| $CsCe_2Cl_7$ | ~26,000 | 7.5 |

TABLE I-continued

Selected Scintillator Properties

| Composition | Light Output, ph/MeV | Energy Resolution (ΔE), % @ 622 keV |
|---|---|---|
| $Cs_3CeBr_6$ | ~28,000 | 9 |
| $CsCe_2Br_7$ | ~40,000 | ~8 |

Figure 4A:
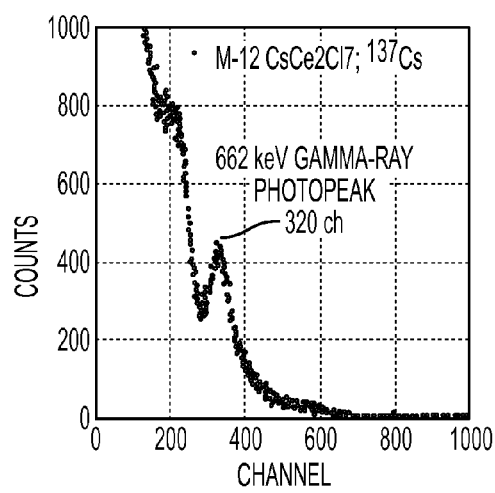
FIG. 4 shows energy spectra of (a) $CsCe_2Cl_7$ and (b) $CsCe_2Cl_7$ crystals, (normalized, with the photopeak of a BGO standard sample at channel no. 100); the spectrum was measured using $^{137}Cs$ gamma-ray source (662 keV).
Figure 4B:
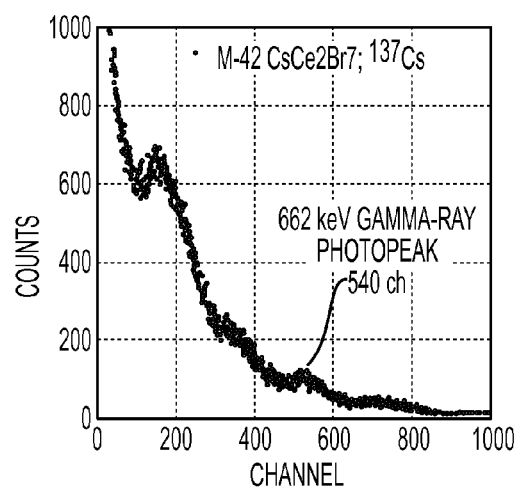

FIG. 3 shows scintillation decay time spectra of (a) $Cs_3CeCl_6$, (b) $Cs_3CeBr_6$, (c) $CsCe_2Cl_7$ and (d) $CsCe_2Br_7$ single crystals. The decay of each crystal can be characterized by a double exponential decay. The decay times for these samples are approximately:

(a) 58 ns (52%) and 293 ns (48%) for $Cs_3CeCl_6$,
(b) 93 ns (45%) and 557 ns (55%) for $Cs_3CeSr_6$,
(c) 55 ns (43%) and 244 ns (57%) for $CsCe_2Cl_7$, and
(d) 20 ns (40%) and 95 ns (60%) for $CsCe_2Br_7$ FIG. 4 shows energy spectra of (a). $CsCe_2Cl_7$ and (h) $CsCe_2Cl_7$ crystals, (normalized, with the photopeak of a BGO standard sample at channel no. 100). The photopeaks are located approximately at channels nos. 320 and 540, respectively.

Figure 5:
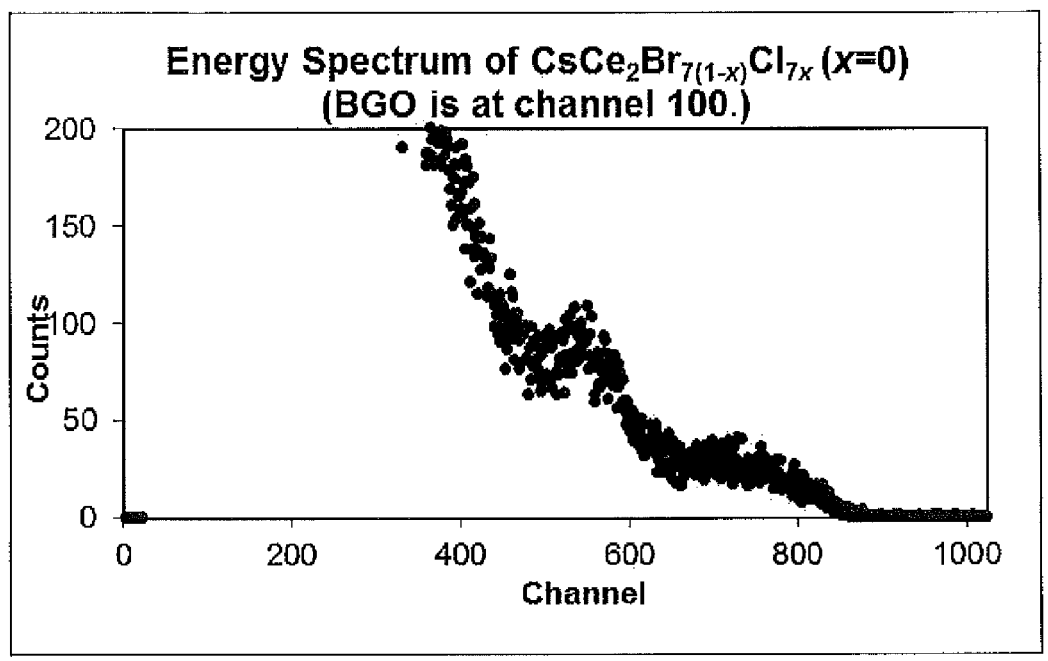
FIG. 5 shows an energy spectrum for a $CsCe_2Br_7$ single crystal (normalized, with the photopeak of a BGO standard sample at channel no. 100).

FIG. 5 shows an energy spectrum for a single crystal of $CsCe_2Br_{7(1-x)}Cl_{7x}$, x=0 (i.e., $CsCe_2Br_7$). The channel number is proportional to the relative light output of the sample. The relative light output (photo peak position) of the reference crystal BGO is 100 on this scale. The relative light output for this sample is thus at least 7 time of that of a BGO crystal. Preliminary tests indicate that the absolute light output of a $CsCe_2Br_{7(1-x)}Cl_{7x}$ (x=0) sample is at least 40,000 photons/MeV.

Figure 6:
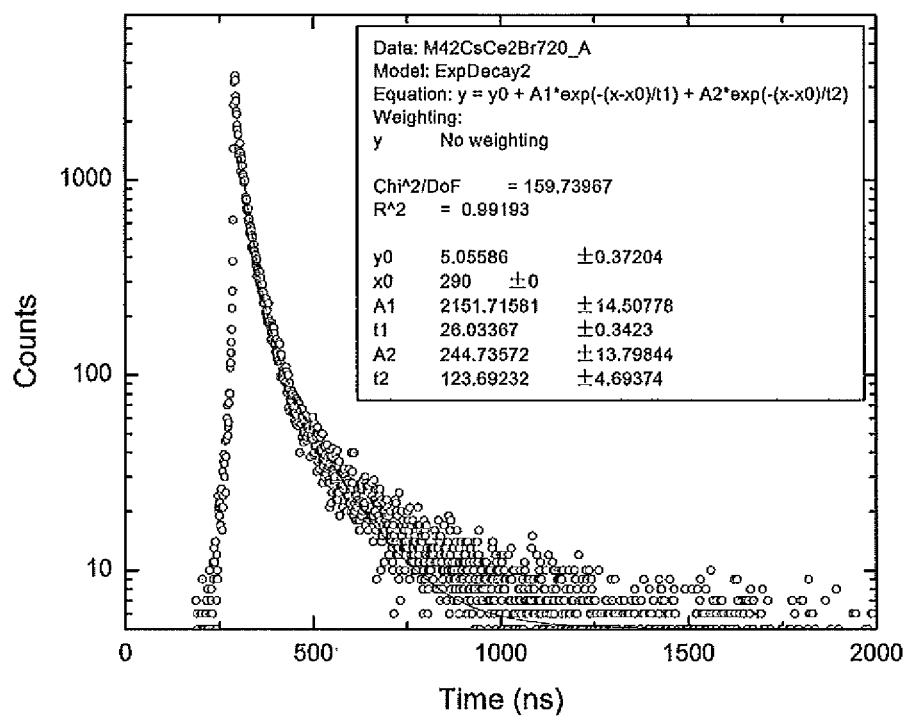
FIG. 6 shows a scintillation decay time spectrum of a $CsCe_2Br_7$ single crystal; the spectrum was measured using $^{137}Cs$ gamma-ray source (662 keV).
Figure 7:
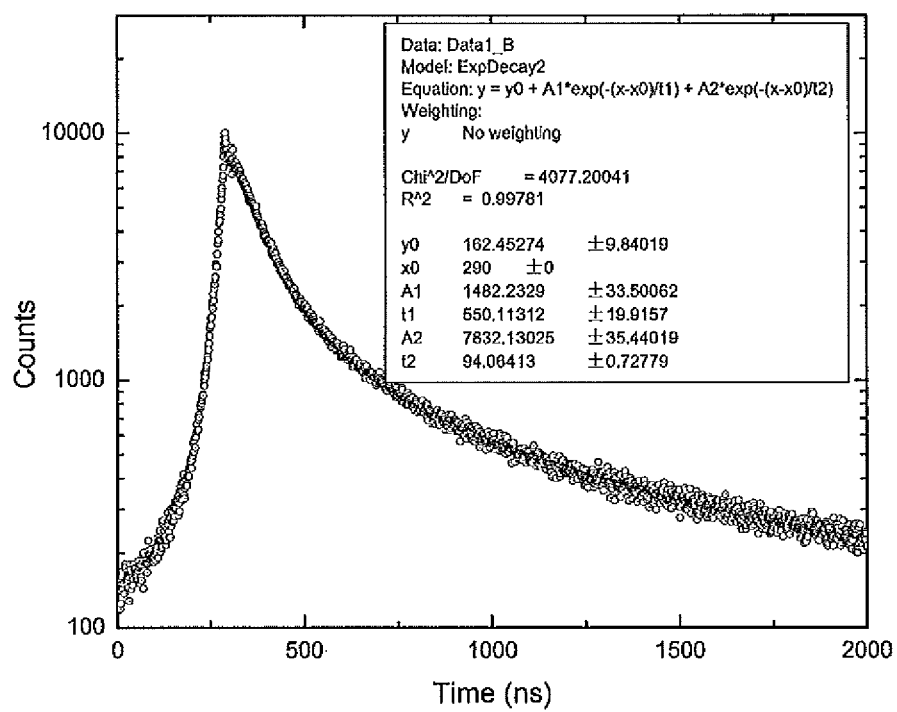
FIG. 7 shows a scintillation decay time spectrum of a $Cs_3CeBr_6$ single crystal; the spectrum was measured using $^{137}Cs$ gamma-ray source (662 keV).
Figure 11:
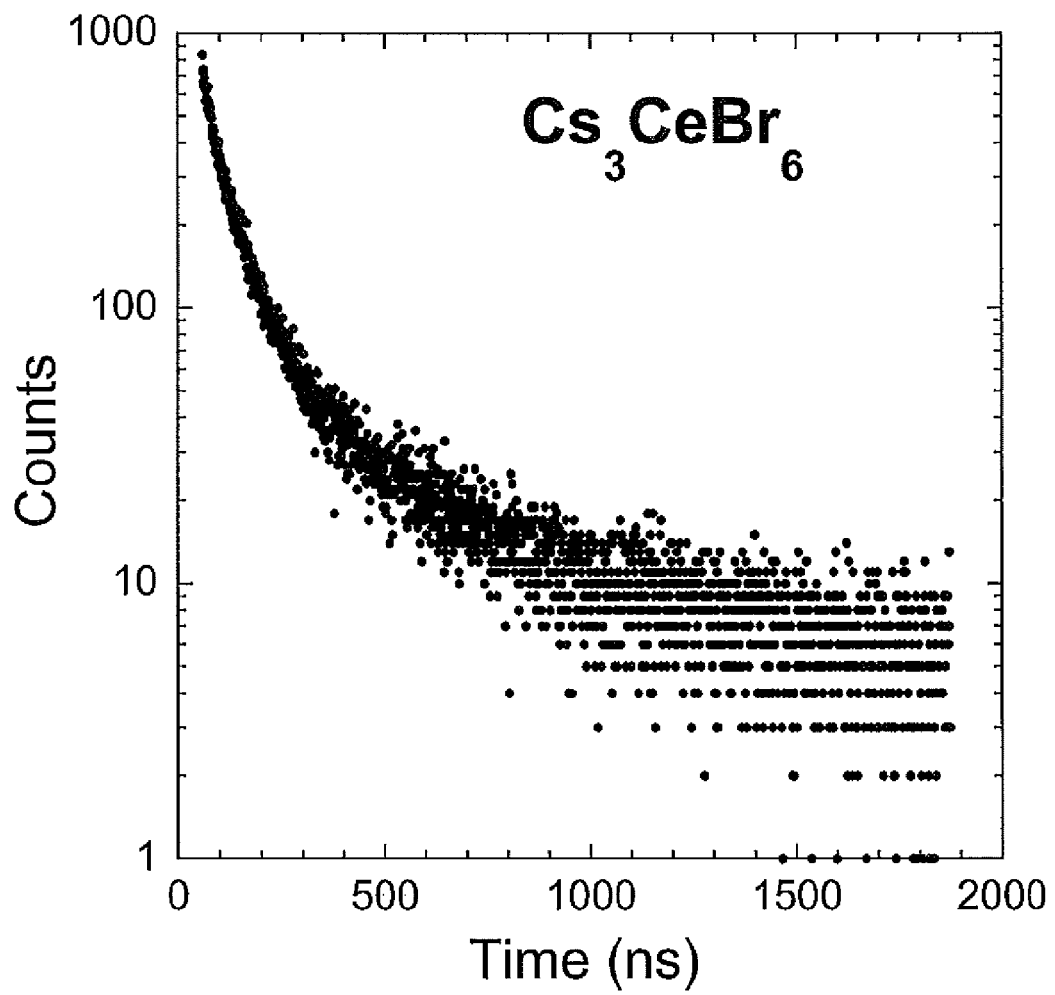
FIG. 11 shows a scintillation decay time spectrum of a $Cs_3CeBr_6$ single crystal; the spectra were measured using $^{137}Cs$ gamma-ray source (662 keV).
Figure 12:
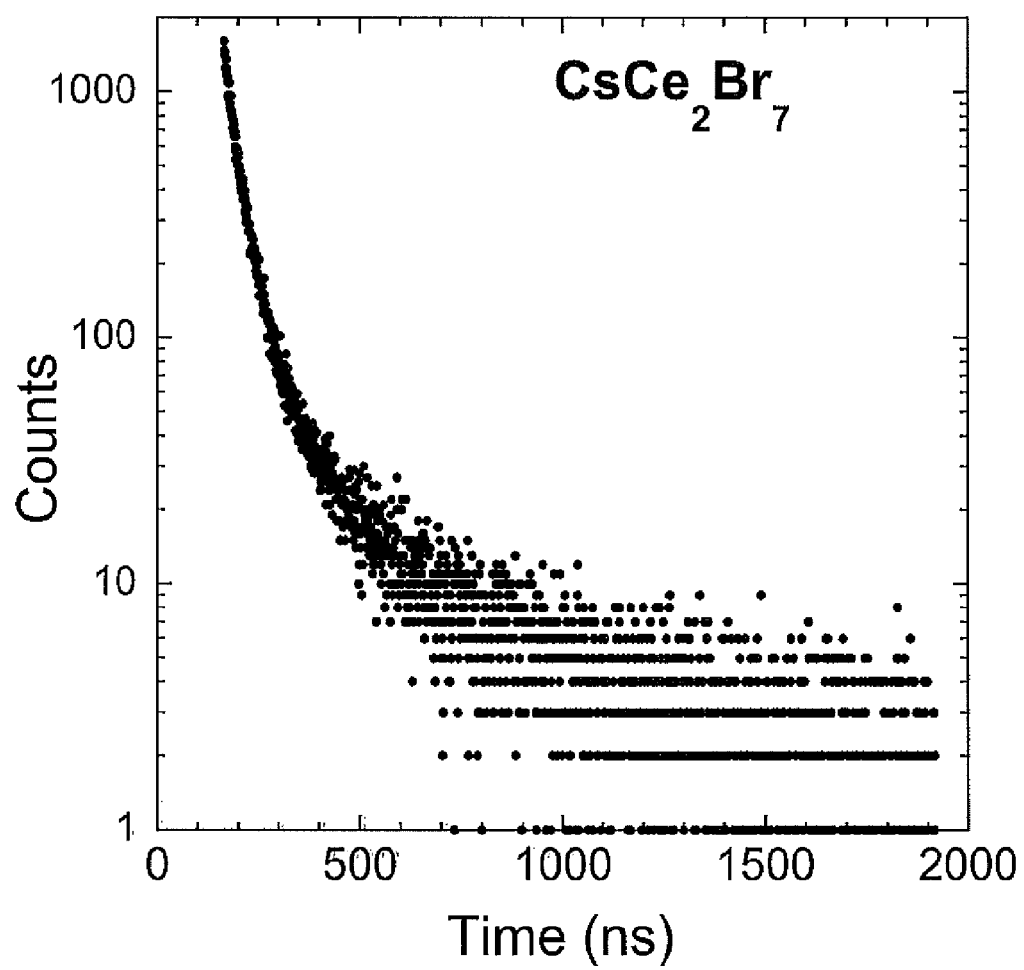
FIG. 12 shows a scintillation decay time spectrum of a $CsCe_2Br_7$ single crystal; the spectra were measured using $^{137}Cs$ gamma-ray source (662 keV).

FIG. 6 shows a scintillation decay time spectrum of a $CsCe_2Br_7$ single crystal; FIG. 7 shows a scintillation decay time spectrum of a single crystal. The spectra were measured using a $^{137}Cs$ gamma-ray source (662 keV). The scintillation decay times calculated for these sample each consist of two components: 26 ns (65%) and 124 ns (35%) for $CsCe_2Br_{7(1-x)}Cl_{7x}$ (x=0), and 94 ns (47%) and 550 ns (53%) for $Cs_3CeBr_{6(1-x)}Cl_{6x}$ (x=0). Additional examples of scintillation decay time spectra are shown in FIGS. 11 and 12.

Figure 8:
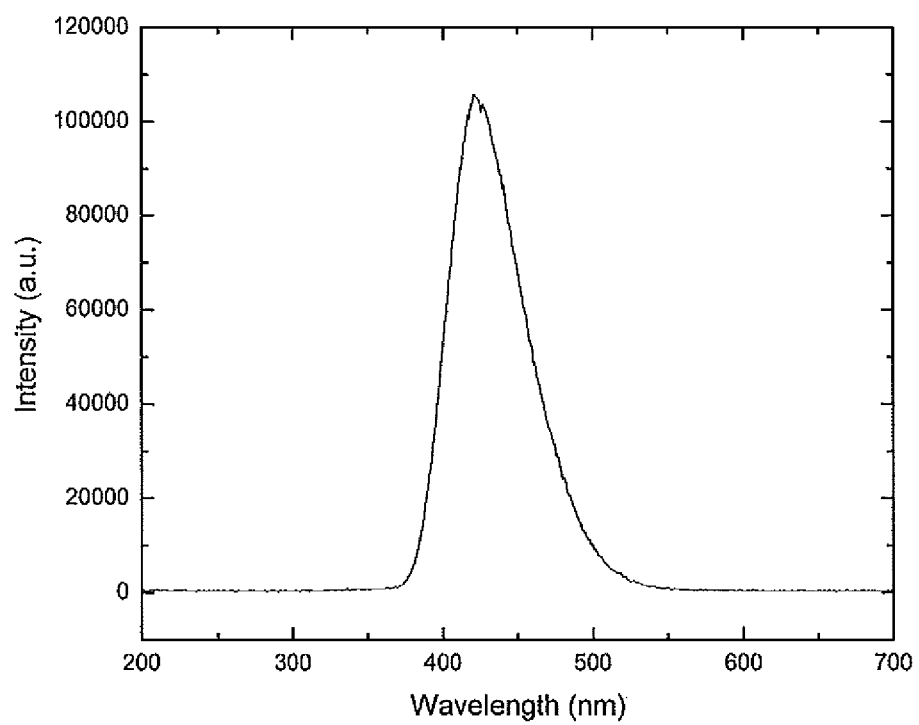
FIG. 8 shows an X-ray excited radioluminescence spectrum of $CsCe_2Br_7$.
Figure 9:
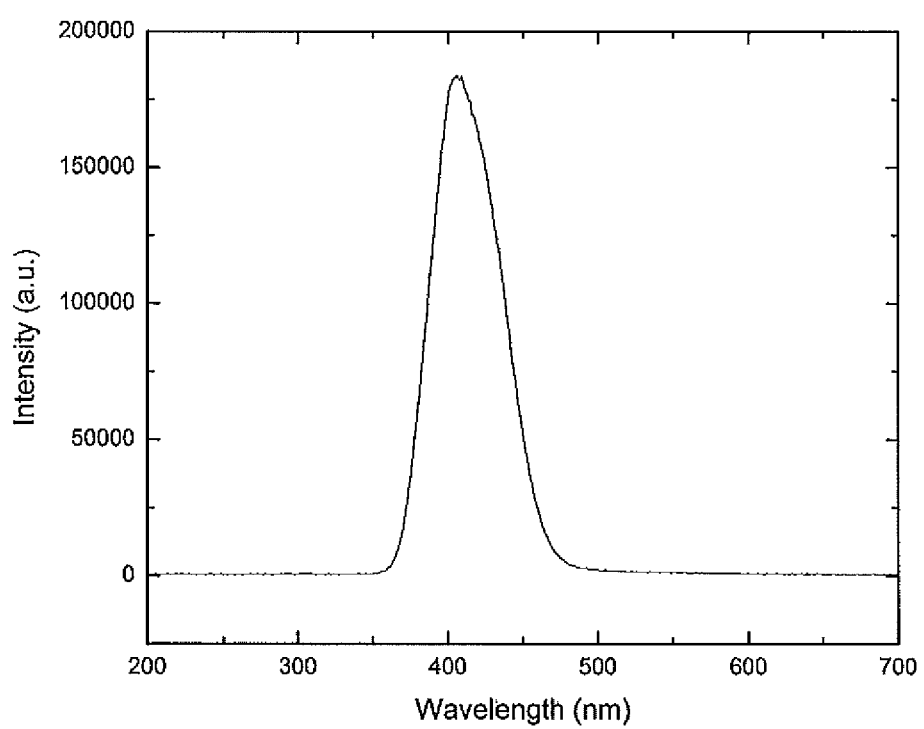
FIG. 9 shows an X-ray excited radioluminescence spectrum of $Cs_3CeBr_6$.
Figure 13:
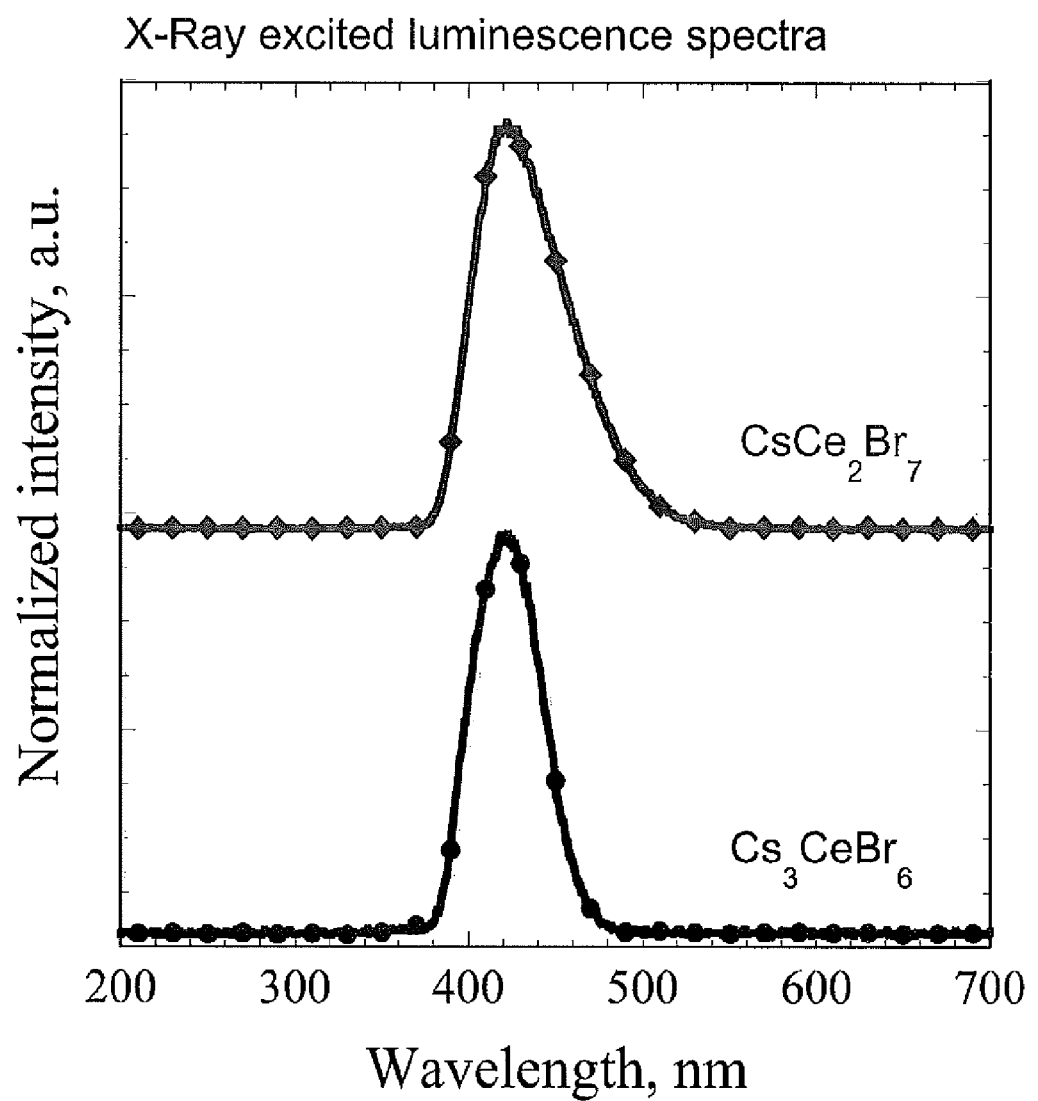
FIG. 13 shows X-ray excited radioluminescence spectra of $CsCe_2BP_7$ and $Cs_3CeBr_6$, respectively.

FIG. 8 shows an X-ray excited radioluminescence spectrum of $CsCe_2Br_7$; FIG. 9 shows an X-ray excited radioluminescence spectrum of $Cs_3CeBr_6$. The emission peak are at approximately 421 nm and 406 nm, respectively. The emission wavelengths of both scintillators are in the sensitive wavelength range for many commercial Photo Multiplier Tubes (PMTs). Additional examples of radioluminescence spectra are shown in FIG. 13

Figure 10:
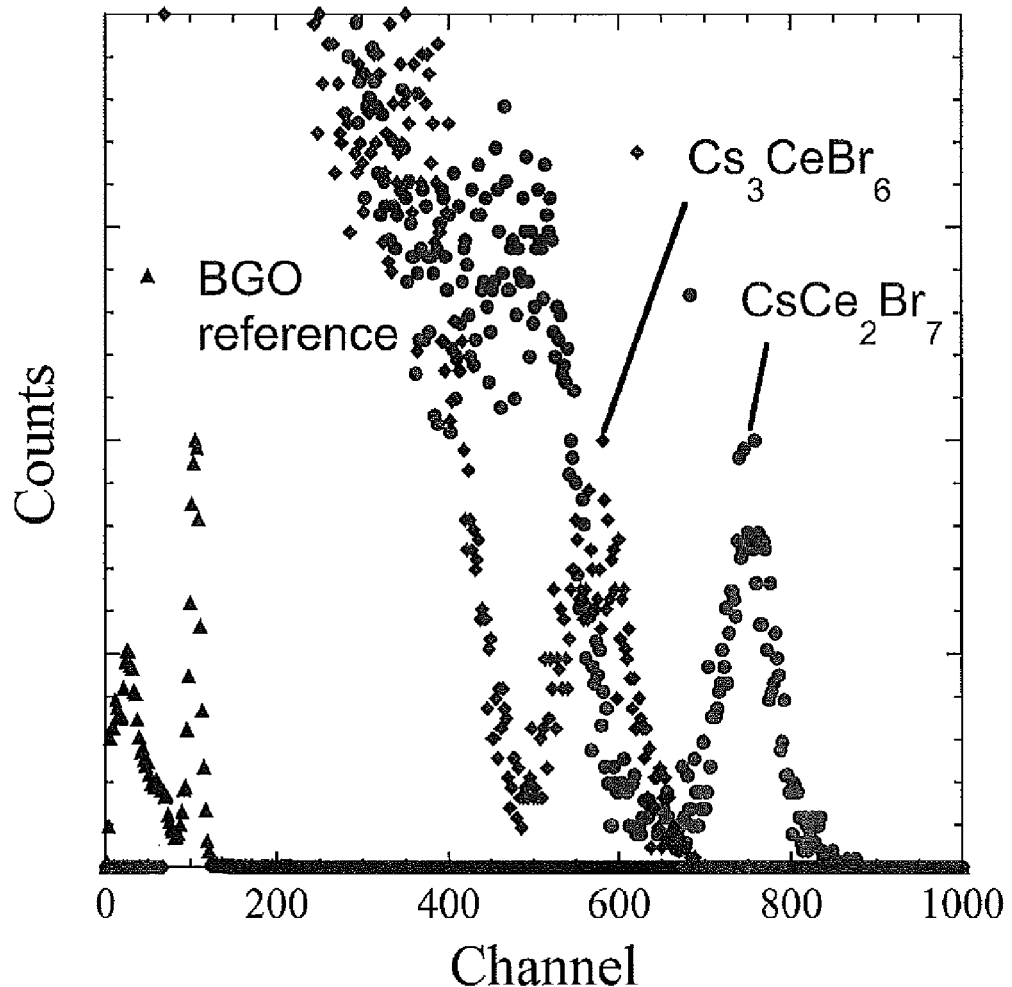
FIG. 10 shows energy spectra of $Cs_3CeBr_6$ and $CsCe_2Br_7$ crystals, respectively (normalized, with the photopeak of a BGO standard sample at channel no. 100); the spectra were measured using $^{137}Cs$ gamma-ray source (662 keV).

FIG. 10 shows energy spectra of $Cs_3CeBr_6$ and $CsCe_2Br_7$ crystals, respectively (normalized, with the photopeak of a BGO standard sample at channel no. 100); the spectra were measured using $^{137}Cs$ gamma-ray source (662 keV).

III. Summary

Thus, halide scintillator crystals with excellent scintillation properties have been produced according to the present disclosure. Because many embodiments of the invention can be made without departing from the spirit and scope of the invention, the invention resides in the claims hereinafter appended.

We claim:

1. A scintillator material comprising a single crystal having a composition of the formula
$A_3MBr_{6(1-x)}Cl_{6x}$, x being greater than or equal to 0 and less than or equal to 1,
wherein A consists essentially of Cs; and
M consists essentially of Ce.

2. The scintillator material of claim 1, having a light output of at least about four times that of BGO when excited with a gamma-ray of 662 keV.

3. A radiation detector, comprising:
a scintillator material of claim 1 adapted to generate photons in response to an impinging radiation; and
a photon detector optically coupled to the scintillator material, arranged to receive the photons generated by the scintillator material and adapted to generate an electrical signal indicative of the photon generation.

4. An imaging method, comprising:
using at least one radiation detector of claim 3 to receive radiation from a plurality of radiation sources distributed in an object to be imaged and generate a plurality of signals indicative of the received radiation; and
based on the plurality of signals, deriving a special distribution of an attribute of the object.

5. The scintillator material of claim 1, wherein x is greater than 0 and less than 1.

6. A scintillator material comprising a single crystal having a composition of the formula
$AM_2Br_{7(1-x)}Cl_{7x}$, x being greater than or equal to 0 and less than or
wherein A consists essentially of Cs, and
M consists essentially of Ce.

7. The scintillator material of claim 6, having a light output of at least about four times that of BGO when excited with a gamma-ray of 662 keV.

8. A radiation detector, comprising:
a scintillator material of claim 6 adapted to generate photons in response to an impinging radiation; and
a photon detector optically coupled to the scintillator material, arranged to receive the photons generated by the scintillator material and adapted to generate an electrical signal indicative of the photon generation.

9. An imaging method, comprising:
using at least one radiation detector of claim 8 to receive radiation from a plurality of radiation sources distributed in an object to be imaged and generate a plurality of signals indicative of the received radiation; and
based on the plurality of signals, deriving a special distribution of an attribute of the object.

10. The scintillator material of claim 6, wherein x is greater than 0 and less than 1.

11. A method of making a scintillator material, the method comprising:
synthesizing a compound having a composition of the formula
$A_3MBr_{6(1-x)}Cl_{6x}$, x being greater than or equal to 0 and less than or equal to 1,
wherein A consists essentially of Cs and
M consists essentially of Ce; and
growing a single crystal from the synthesized compound using Bridgman method.

12. The method of claim 11, wherein the synthesizing step comprises heating a mixture of a plurality of halides above their respective melting temperatures.

13. The method of claim 11, wherein x is greater than 0 and less than 1.

14. A method of making a scintillator material, the method comprising:
synthesizing a compound having a composition of the formula
$AM_2Br_{7(1-x)}Cl_{7x}$, x being greater than or equal to 0 and less than or equal to 1, wherein A consists essentially of Cs; and M consists essentially of Ce; and growing a single crystal from the synthesized compound using Bridgman method.

15. The method of claim 14, where in the synthesizing step comprises heating a mixture of a plurality of halides above their respective melting temperatures.

16. The method of claim 14, wherein x is greater than 0 and less than 1.

17. A scintillator material comprising a single crystal having a composition of the formula $AM_2Br_7$, wherein A consists essentially of Cs, and M consists essentially of Ce.

* * * * *